(12) United States Patent
Curtis et al.

(10) Patent No.: US 9,142,408 B2
(45) Date of Patent: Sep. 22, 2015

(54) LIQUID PRECURSOR FOR DEPOSITION OF INDIUM SELENIDE AND METHOD OF PREPARING THE SAME

(75) Inventors: Calvin J. Curtis, Lakewood, CO (US); Alexander Miedaner, Boulder, CO (US); Marinus Franciscus Antonius Maria van Hest, Lakewood, CO (US); David S. Ginley, Denver, CO (US); Peter A. Hersh, Denver, CO (US); Louay Eldada, Austin, TX (US); Billy J. Stanbery, Austin, TX (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 1001 days.

(21) Appl. No.: 13/136,982

(22) Filed: Aug. 16, 2011

(65) Prior Publication Data
US 2012/0094431 A1 Apr. 19, 2012

Related U.S. Application Data

(60) Provisional application No. 61/401,607, filed on Aug. 16, 2010.

(51) Int. Cl.
*H01L 21/02* (2006.01)
*C23C 18/12* (2006.01)
*H01L 31/032* (2006.01)
*H01L 31/20* (2006.01)

(52) U.S. Cl.
CPC ...... *H01L 21/02568* (2013.01); *C23C 18/1204* (2013.01); *H01L 21/02628* (2013.01); *H01L 31/0322* (2013.01); *H01L 31/20* (2013.01); *Y02E 10/541* (2013.01)

(58) Field of Classification Search
CPC . H01L 21/06; H01L 21/208; H01L 21/02568; C09D 7/12; C23C 18/1204; H01B 7/0027
USPC .............. 438/102; 257/E21.068; 106/287.18; 252/500
See application file for complete search history.

(56) References Cited

U.S. PATENT DOCUMENTS

| 2,838,149 A | 6/1958 | Burton |
| 2,846,343 A | 8/1958 | Mason |
| 3,014,779 A | 12/1961 | Conn et al. |

(Continued)

FOREIGN PATENT DOCUMENTS

| CA | 2712114 | 8/2009 |
| CN | 15472760 | 11/2004 |

(Continued)

OTHER PUBLICATIONS

International Search Report and Written Opinion from PCT/US11/01434, Feb. 22, 2012.

(Continued)

*Primary Examiner* — Mark Kopec
*Assistant Examiner* — Danny N Kang
(74) *Attorney, Agent, or Firm* — John C. Stolpa; Michael A. McIntyre; Suzanne C. Walts

(57) ABSTRACT

Liquid precursors containing indium and selenium suitable for deposition on a substrate to form thin films suitable for semiconductor applications are disclosed. Methods of preparing such liquid precursors and method of depositing a liquid precursor on a substrate are also disclosed.

17 Claims, 3 Drawing Sheets

(56) References Cited

U.S. PATENT DOCUMENTS

| | | |
|---|---|---|
| 3,629,036 A | 12/1971 | Isaacson |
| 4,088,544 A | 5/1978 | Hutkin |
| 4,267,398 A | 5/1981 | Rothwarf |
| 4,315,097 A | 2/1982 | Solomon |
| 4,322,571 A | 3/1982 | Stanbery |
| 4,392,451 A | 7/1983 | Mickelsen et al. |
| 4,479,847 A | 10/1984 | McCaldin et al. |
| 4,523,051 A | 6/1985 | Mickelsen et al. |
| RE31,968 E | 8/1985 | Mickelsen et al. |
| 4,571,448 A | 2/1986 | Barnett |
| 4,609,820 A | 9/1986 | Miyamoto |
| 4,611,091 A | 9/1986 | Choudary et al. |
| 4,674,434 A | 6/1987 | Ishihara |
| 4,737,384 A | 4/1988 | Murthy et al. |
| 4,823,176 A | 4/1989 | Baliga et al. |
| 4,864,599 A | 9/1989 | Saegusa et al. |
| 4,902,395 A | 2/1990 | Yoshimura |
| 4,902,398 A | 2/1990 | Homstad |
| 4,902,668 A | 2/1990 | Whitcomb et al. |
| 5,028,274 A | 7/1991 | Basol et al. |
| 5,055,150 A | 10/1991 | Rosenfeld et al. |
| 5,124,308 A | 6/1992 | Albin et al. |
| 5,132,248 A | 7/1992 | Drummond et al. |
| 5,182,231 A | 1/1993 | Hongo et al. |
| 5,248,621 A | 9/1993 | Sano |
| 5,298,449 A | 3/1994 | Kikuchi |
| 5,396,839 A | 3/1995 | Rice |
| 5,405,802 A | 4/1995 | Yamagata et al. |
| 5,436,204 A | 7/1995 | Albin et al. |
| 5,441,897 A | 8/1995 | Noufi et al. |
| 5,477,088 A | 12/1995 | Rockett et al. |
| 5,477,288 A | 12/1995 | Miyazaki et al. |
| 5,567,469 A | 10/1996 | Wada et al. |
| 5,578,503 A | 11/1996 | Karg et al. |
| 5,626,688 A | 5/1997 | Probst et al. |
| 5,628,817 A | 5/1997 | Fugleberg et al. |
| 5,674,555 A | 10/1997 | Birkmire et al. |
| 5,687,218 A | 11/1997 | Nakayama |
| 5,705,011 A | 1/1998 | Bodford et al. |
| 5,730,852 A | 3/1998 | Bhattacharya et al. |
| 5,731,031 A | 3/1998 | Bhattacharya et al. |
| 5,756,240 A | 5/1998 | Roberts et al. |
| 5,759,954 A | 6/1998 | Taguchi et al. |
| 5,794,163 A | 8/1998 | Paterson et al. |
| 5,846,638 A | 12/1998 | Meissner |
| 5,858,121 A | 1/1999 | Wada et al. |
| 5,858,628 A | 1/1999 | Yoshida et al. |
| 5,948,176 A | 9/1999 | Ramanathan et al. |
| 5,985,691 A | 11/1999 | Basol et al. |
| 6,021,207 A | 2/2000 | Puthuff et al. |
| 6,023,020 A | 2/2000 | Nishitani et al. |
| 6,026,082 A | 2/2000 | Astrin |
| 6,072,818 A | 6/2000 | Hayakawa |
| 6,100,165 A | 8/2000 | Sakaguchi et al. |
| 6,121,541 A | 9/2000 | Arya |
| 6,126,740 A | 10/2000 | Schulz et al. |
| 6,127,202 A | 10/2000 | Kapur et al. |
| 6,141,356 A | 10/2000 | Gorman |
| 6,146,979 A | 11/2000 | Henley et al. |
| 6,185,418 B1 | 2/2001 | MacLellan et al. |
| 6,187,653 B1 | 2/2001 | Hui et al. |
| 6,190,453 B1 | 2/2001 | Boydston et al. |
| 6,225,190 B1 | 5/2001 | Bruel et al. |
| 6,225,199 B1 | 5/2001 | Han et al. |
| 6,251,754 B1 | 6/2001 | Ohshima et al. |
| 6,313,479 B1 | 11/2001 | Zhang et al. |
| 6,323,417 B1 | 11/2001 | Gillespie et al. |
| 6,339,695 B1 | 1/2002 | Clark |
| 6,368,892 B1 | 4/2002 | Arya |
| 6,372,538 B1 | 4/2002 | Wendt et al. |
| 6,379,585 B1 * | 4/2002 | Vecht et al. ............ 252/301.35 |
| 6,399,486 B1 | 6/2002 | Chen et al. |
| 6,455,398 B1 | 9/2002 | Fonstad, Jr. et al. |
| 6,475,354 B1 | 11/2002 | Toyama |
| 6,500,733 B1 | 12/2002 | Stanbery |
| 6,521,511 B1 | 2/2003 | Inoue et al. |
| 6,559,372 B2 | 5/2003 | Stanbery |
| 6,576,291 B2 | 6/2003 | Bawendi et al. |
| 6,593,213 B2 | 7/2003 | Stanbery |
| 6,599,378 B1 | 7/2003 | Hagiwara et al. |
| 6,669,830 B1 | 12/2003 | Inoue et al. |
| 6,720,239 B2 | 4/2004 | Stanbery |
| 6,736,986 B2 | 5/2004 | Stanbery |
| 6,787,012 B2 | 9/2004 | Stanbery |
| 6,797,874 B2 | 9/2004 | Stanbery |
| 6,821,337 B2 | 11/2004 | Bawendi et al. |
| 6,830,778 B1 | 12/2004 | Schulz et al. |
| 6,852,920 B2 | 2/2005 | Sager et al. |
| 6,855,202 B2 | 2/2005 | Alivisatos et al. |
| 6,881,647 B2 | 4/2005 | Stanbery |
| 6,936,761 B2 | 8/2005 | Pichler |
| 6,974,976 B2 | 12/2005 | Hollars |
| 6,979,370 B2 | 12/2005 | Vaartstra |
| 6,987,071 B1 | 1/2006 | Bollman et al. |
| 7,045,205 B1 | 5/2006 | Sager |
| 7,094,651 B2 | 8/2006 | Mitzi et al. |
| 7,097,902 B2 | 8/2006 | Blanton et al. |
| 7,306,823 B2 | 12/2007 | Sager et al. |
| 7,341,917 B2 | 3/2008 | Milliron et al. |
| 7,390,715 B2 | 6/2008 | Ou et al. |
| 7,422,696 B2 | 9/2008 | Mirkin et al. |
| 7,663,057 B2 | 2/2010 | Yu et al. |
| 7,691,294 B2 | 4/2010 | Chung et al. |
| 7,838,063 B2 | 11/2010 | Yoon |
| 7,867,413 B2 | 1/2011 | Lee et al. |
| 7,879,696 B2 | 2/2011 | Kunze et al. |
| 7,922,804 B2 | 4/2011 | Chuang |
| 8,021,641 B2 | 9/2011 | Curtis et al. |
| 8,048,477 B2 | 11/2011 | Van Duren et al. |
| 8,057,850 B2 | 11/2011 | Curtis et al. |
| 8,366,967 B2 | 2/2013 | Keszler et al. |
| 2002/0006470 A1 | 1/2002 | Eberspacher et al. |
| 2002/0016188 A1 | 2/2002 | Kashiwamura |
| 2002/0043279 A1 | 4/2002 | Karg |
| 2003/0051664 A1 | 3/2003 | Stanbery |
| 2003/0052391 A1 | 3/2003 | Stanbery |
| 2003/0054582 A1 | 3/2003 | Stanbery |
| 2003/0054662 A1 | 3/2003 | Stanbery |
| 2003/0054663 A1 | 3/2003 | Stanbery |
| 2003/0123167 A1 | 7/2003 | Kolberg et al. |
| 2003/0201010 A1 | 10/2003 | Koyannagi et al. |
| 2004/0063320 A1 | 4/2004 | Hollars |
| 2004/0131792 A1 | 7/2004 | Bhattacharya |
| 2004/0219730 A1 | 11/2004 | Basol |
| 2004/0250848 A1 | 12/2004 | Sager et al. |
| 2004/0261841 A1 | 12/2004 | Negami et al. |
| 2005/0000414 A1 | 1/2005 | Culik et al. |
| 2005/0009225 A1 | 1/2005 | Mitzi et al. |
| 2005/0028861 A1 | 2/2005 | Aoki et al. |
| 2005/0084689 A1 | 4/2005 | Hwang et al. |
| 2005/0095422 A1 | 5/2005 | Sager et al. |
| 2005/0098204 A1 | 5/2005 | Roscheisen et al. |
| 2005/0098205 A1 | 5/2005 | Roscheisen et al. |
| 2005/0109392 A1 | 5/2005 | Hollars |
| 2005/0121068 A1 | 6/2005 | Sager et al. |
| 2005/0158909 A1 | 7/2005 | Milliron et al. |
| 2005/0183767 A1 | 8/2005 | Yu et al. |
| 2005/0183768 A1 | 8/2005 | Roscheisen et al. |
| 2005/0186342 A1 | 8/2005 | Sager et al. |
| 2005/0218377 A1 | 10/2005 | Lawandy |
| 2006/0062902 A1 | 3/2006 | Sager et al. |
| 2006/0207644 A1 | 9/2006 | Robinson et al. |
| 2007/0077429 A1 | 4/2007 | Mirkin et al. |
| 2007/0093006 A1 | 4/2007 | Basol |
| 2007/0119522 A1 | 5/2007 | Grier et al. |
| 2007/0152236 A1 | 7/2007 | Halpert et al. |
| 2007/0163638 A1 | 7/2007 | Van Duren et al. |
| 2007/0163642 A1 | 7/2007 | Van Duren et al. |
| 2007/0163643 A1 | 7/2007 | Van Duren et al. |
| 2007/0163644 A1 | 7/2007 | Van Duren et al. |
| 2007/0166453 A1 | 7/2007 | Van Duren et al. |
| 2007/0169813 A1 | 7/2007 | Robinson et al. |
| 2007/0178620 A1 | 8/2007 | Basol |
| 2007/0234949 A1 | 10/2007 | Ahan et al. |

(56) References Cited

U.S. PATENT DOCUMENTS

| | | | |
|---|---|---|---|
| 2007/0261951 A1 | 11/2007 | Ye et al. |
| 2007/0264504 A1 | 11/2007 | Mitzi et al. |
| 2008/0057616 A1 | 3/2008 | Robinson et al. |
| 2008/0121277 A1 | 5/2008 | Robinson et al. |
| 2008/0124831 A1 | 5/2008 | Robinson et al. |
| 2008/0135099 A1 | 6/2008 | Yu et al. |
| 2008/0142081 A1 | 6/2008 | Yu et al. |
| 2008/0142082 A1 | 6/2008 | Ye et al. |
| 2008/0149176 A1 | 6/2008 | Sager et al. |
| 2008/0175982 A1 | 7/2008 | Robinson et al. |
| 2008/0194103 A1 | 8/2008 | Wagner |
| 2008/0242088 A1 | 10/2008 | Suzuki |
| 2009/0004445 A1 | 1/2009 | Park et al. |
| 2009/0214763 A1 | 8/2009 | Joo et al. |
| 2009/0226603 A1 | 9/2009 | Lowrey |
| 2009/0260670 A1 | 10/2009 | Li |
| 2009/0261951 A1 | 10/2009 | Chang et al. |
| 2009/0280624 A1 | 11/2009 | Curtis et al. |
| 2009/0305449 A1 | 12/2009 | Bollman et al. |
| 2010/0096015 A1 | 4/2010 | Robinson et al. |
| 2010/0319776 A1 | 12/2010 | Choe et al. |
| 2011/0008244 A1 | 1/2011 | Brutchey et al. |
| 2011/0014377 A1 | 1/2011 | Mosley |
| 2011/0020981 A1 | 1/2011 | Mosley et al. |
| 2011/0065224 A1 | 3/2011 | Bollman et al. |
| 2011/0076798 A1 | 3/2011 | Calzia et al. |
| 2011/0076799 A1 | 3/2011 | Calzia et al. |
| 2011/0120343 A1 | 5/2011 | Calzia et al. |
| 2011/0143051 A1 | 6/2011 | Ohashi et al. |
| 2011/0189080 A1 | 8/2011 | Curtis et al. |
| 2011/0287610 A1 | 11/2011 | Calzia et al. |
| 2011/0287614 A1 | 11/2011 | Calzia et al. |
| 2011/0312160 A1 | 12/2011 | Eldada et al. |
| 2012/0082794 A1 | 4/2012 | Calzia et al. |
| 2012/0094431 A1 | 4/2012 | Curtis et al. |
| 2012/0213924 A1 | 8/2012 | Mosley et al. |
| 2013/0078384 A1 | 3/2013 | Mosley et al. |
| 2013/0323878 A1 | 12/2013 | Curtis et al. |
| 2014/0087512 A1 | 3/2014 | Curtis et al. |

FOREIGN PATENT DOCUMENTS

| | | |
|---|---|---|
| CN | 101079454 | 11/2007 |
| DE | 4225385 | 2/1994 |
| EP | 0381509 | 8/1990 |
| EP | 0621130 | 10/1994 |
| EP | 0661760 | 5/1995 |
| EP | 0763859 | 3/1997 |
| EP | 1870943 | 12/1998 |
| EP | 0989593 | 3/2000 |
| EP | 1255305 | 6/2002 |
| EP | 1385364 | 1/2004 |
| GB | 1119372 | 7/1968 |
| GB | 1194625 | 6/1970 |
| JP | 2009528681 | 8/2009 |
| JP | 2009528682 | 8/2009 |
| JP | 2009540537 | 11/2009 |
| JP | 2010132521 | 6/2010 |
| WO | 97/22152 | 6/1997 |
| WO | 00/33363 | 6/2000 |
| WO | 03/002225 | 1/2003 |
| WO | 03/026022 | 3/2003 |
| WO | 03/026023 | 3/2003 |
| WO | 03/026024 | 3/2003 |
| WO | 03/026025 | 3/2003 |
| WO | 03/026026 | 3/2003 |
| WO | 03/026028 | 3/2003 |
| WO | 2005/017978 | 2/2005 |
| WO | 2005/059952 | 6/2005 |
| WO | 2006/041199 | 4/2006 |
| WO | WO 2006101986 | 9/2006 |
| WO | 2006/133129 | 12/2006 |
| WO | 2007/082080 | 7/2007 |
| WO | 2007/082084 | 7/2007 |
| WO | 2007/082085 | 7/2007 |
| WO | 2008/021604 | 2/2008 |
| WO | 2008/027571 | 3/2008 |
| WO | WO 2008057119 | 5/2008 |
| WO | WO 2008063190 | 5/2008 |
| WO | WO 2008063190 A2 * | 5/2008 |
| WO | WO 2009051862 | 4/2009 |
| WO | WO 2009151665 | 12/2009 |
| WO | WO 2010135667 | 11/2010 |
| WO | WO 2010138635 | 12/2010 |
| WO | WO 2010138636 | 12/2010 |
| WO | WO 2011096914 | 8/2011 |
| WO | WO 2010135665 | 11/2011 |
| WO | WO 2011146115 | 11/2011 |

OTHER PUBLICATIONS

Nurdan Demirci Sankir, Flexible Electronics: Materials and Device Fabrication, dissertation Virginia Polytechnic Institute, Dec. 7, 2005.

G. Daniel Lilly, Metal and Semiconductor Nanoparticle Self-Assembly, dissertation University of Michigan, 2009.

Kapur et al, Lab to Large Scale Transition for Non-Vacuum Thin Film CIGS Solar Cells, NREL/SR-520-35574, Feb. 2004.

Umur Caglar, Studies of Inkjet Printing Technology with Focus on Electronic Materials, Julkaisu 863, Publication 863, Tampere University of Technology, 2009.

Hatice Sengul et al., Toward Sustainable Nanoproducts, An Overview of Nanomanufacturing Methods, Journal of Industrial Ecology, vol. 12, No. 3, Yale University, 2008.

Dusastre et al., Convenient, room-temperature, amine-assisted routes to metal sulfides, selenides and tellureides, J. Chem Soc., Dalton Trans., 1997, pp. 3505-3508.

Znekuda Malik et al., Atmospheric pressure synthesis of $In_2Se_3$, $Cu_2Se$, and $CuInSe_2$ without external selenization from solution precursors, J. Mater. Res., vol. 24, No. 4, 2009.

Mirasano et al., The effect of annealing process on CIGS films prepared by chemical bath deposition, University of Nebraska, 2007.

Kapur et al, Lab to Large Scale Transition for Non-Vacuum Thin Film CIGS Solar Cells, NREL/SR-520-37284, Jan. 2005.

International search report and written opinion from PCT/US2011/001434, Feb. 22, 2012.

International search report and written opinion from PCT/US2006/060757, Nov. 20, 2008.

International written opinion from PCT/US2006/060756, Jul. 30, 2007.

International preliminary report from PCT/US2006/060756, May 12, 2009.

International search report and written opinion from PCT/US2011/000870, Sep. 1, 2011.

International preliminary report from PCT/US2010/000311, Aug. 7, 2012.

International search report from PCT/US2010/000311, Apr. 14, 2010.

English language translation of abstract of Korean Patent Publication No. 10-2002-000777, Jan. 29, 2002.

English language translation of abstract of Japanese Patent Publication No. 2003-282600, Oct. 3, 2003.

Kapur et al, Non-vacuum processing of $CuIn_{1-y}Ga_ySe_2$ solar cells on rigid and flexible substrates using nanoparticle precursor inks, Thin Solid Films, 431-432, 2003, pp. 53-57.

English language translation of abstract of Japanese Patent Publication No. 2009528681.

English language translation of abstract of Japanese Patent Publication No. 2009528682.

English language translation of abstract of Japanese Patent Publication No. 2009540537.

English language translation of abstract of Japanese Patent Publication No. 2010132521.

Anderson et al, "Processing of $CuInSe_2$—Based Solar Cells: Characterization of Deposition Processes in Terms of Chemical Reaction Analyses", Final Report, May 6, 1995-Dec. 31, 1998, National Renewable Energy Laboratory, NREL/SR-520-30391, Jun. 2001, pp. 1-400.

(56) References Cited

OTHER PUBLICATIONS

Arya et al, "Solar Cells and Submodules on CIS Prepared by EDCF Method", Photovoltaic Specialists Conference, 1993., Conference Record of the Twenty Third IEEE, May 1993, pp. 516-520.

Braunger et al. "Influence of Sodium on the Growth of Polycrystalline Cu(In,Ga)Se2 Thin Films" Thin Solid Films, Feb. 2000, vol. 361-362, pp. 161-166.

Burda et al., "Chemistry and Properties of Nanocrystals of Different Shapes"; Chemical Reviews, Apr. 2005, vol. 105, No. 4, pp. 1025-1102.

Cahen et al, "Room Temperature Tailoring of Electrical Properties of Ternary and Multinary Chalcogenide Semiconductors", Proceedings of the 9th International Conference of Ternary and Multinary Compounds, Yokohama,1993; The Japanese Journal of Applied Physics, 1993, vol. 32, Suppl. 32-3, pp. 660-661.

Caspar et al., "Five-fold Symmetry in Crystalline Quasicrystal Lattices", Proceedings of the National Academy of Sciences of the United States of America, Dec. 1996, vol. 93, No. 25, pp. 14271-14278.

Chang et al, "Novel Multilayer Process for CuInSe2 Thin Film Formation by Rapid Thermal Processing", Material Res. Society Symposium Proceedings, 1998, vol. 485, pp. 163-168.

Chen et al., "Thin Film CuInGeSe2 Cell Development", IEEE,1993, pp. 422-425.

Chun et al., "Synthesis of CuInGaSe2 Nanoparticles by Solvothermal Route," Thin Solid Films, Jun. 2005, vol. 480-481, No. 1, pp. 46-49.

Contreras et al, "Progress Toward 20% Efficiency in Cu(In, Ga)Se2 Polycrystalline Thin-film Solar Cells," Progress in Photovoltaics Research and Applications, Short Communication: Accelerated Publication, Jul./Aug. 1999, vol. 7, No. 4, pp. 311-316.

Cyganik et al., "Substructure Formation during Pattern Transposition from Substrate into Polymer Blend Film", Europhysics Letters, Jun. 2003, vol. 62, No. 6, pp. 855-861.

Dhere et al., "Low Toxic Processing of Thin and Ultra-thin CIGSS Absorber Solar Cells", Florida Solar Energy Center, University of Central Florida, pp. 1-2, Dec. 2008.

Eberspacher et al, "Non-Vacuum Techniques for Fabricating Thin-Film CIGS", IEEE, 2000, pp. 517-520.

Ginley, "Inkjet Direct Write Solar Cells", NREL Project, Dec. 7, 2005, pp. 1-2.

Grisaru et al., "Microwave-assisted Polyol Synthesis of CuInTe2 and CuInSe2 Nanoparticles", Inorganic Chemistry, Nov. 2003, vol. 42, No. 22, pp. 7148-7155.

Gullén et al, "Reaction Pathways to CuInSe2 Formation from Electrodeposited Precursors", Journal of The Electrochemical Society, May 2005, vol. 142, No. 6, pp. 1834-1838.

Hassan et al, "Evaluation and Characterization of Polycrystalline CuInSe2 Thin Films Prepared by the Sandwich Structure Technique", Semiconductor Science and Technology, 1994, vol. 9, No. 6, pp. 1255-1260.

Hiraga et al., "Formation of Decagonal Quasicrystal in the Al—Pd—Mn System and its Structure", Japanese Journal of Applied Physics, Sep. 1991, vol. 30, No. 9A, pp. 2028-2034.

Hollingsworth et al., "Catalyzed Growth of a Metastable InS Crystal Structure as Collidial Crystals", Journal of the American Chemical Society, 2000, vol. 122, pp. 3562-3563.

Hua et al., "Electroluminescent Properties of Device Based on ZnS:Tb/CdS Core-shell Nanocrystals", Chemical Physics Letters, 2006, vol. 419, pp. 269-272.

Jiang et al., "Elemental Solvothermal Reaction to Produce Ternary Semiconductor CuInE2(E=S, Se) Nanorods", Inorganic Chemistry, 2000, vol. 39, No. 14, 2964-2965.

Kazmerski et al., "Thin-film CuInSe2/CdS Heterojunction Solar Cells", Applied Physics Letters, Aug. 1976, vol. 29, No. 4, pp. 268-270 Aug. 1976.

Kerr et al., "Rapid Thermal Processing of CIS Precursors", IEEE, 2002, pp. 676-679.

Keyes et al., "Influence of Na on the Electo-optical Properties of Cu(In,Ga)Se2," Photovoltaic Specialists Conference, Conference Record of the Twenty-Sixth IEEE Sep./Oct. 1997, Anaheim, CA, pp. 479-482.

Kumar et al., "Shape Control of II-VI Semiconductor Nanomaterials"; Small, Mar. 2006, vol. 2, No. 3, pp. 316-329.

Lammasniemi et al., "Characteristics of Indium Phosphide Solar Cells Bonded in Silicon", Photovoltaic Specialists Conference, Conference Record of the Twenty Third IEEE, May 1993, pp. 763•767.

Lee et al., "Field-assisted Bonding Below 200° C. Using Metal and Glass Thin-film Interlayers," Applied Physics Letters, Mar. 1987, vol. 50, No. 9, pp. 522-524.

Leterrier et al., "Mechanical Properties of Transparent Functional Thin Films for Flexible Displays", Society of Vacuum Coaters, 46th Annual Technical Conference Proceedings, 2003, pp. 1-6.

Li et al. "Effects of Buffer Layer Processing on CIGS Excess Carrier Lifetime: Application of Dual-beam Optical Modulation to Process Analysis," Photovoltaic Specialists Conference,Conference Record of the Twenty Fifth IEEE, May 1996, pp. 821-824.

Li et al., "Synthesis by a Solvothermal Route and Characterization of CuInSe2 Nanowhiskers and Nanoparticles" Advanced Materials, Dec. 1999, vol. 11, No. 17, pp. 1456-1459.

Li, et al., "Sonochemical Process for the Preparation of alpha-CuSe Nanocrystals and Flakes", Journal of Materials Chemistry, 2002, vol. 12, pp. 3723-3727.

Manna et al., "First-Principles Modeling of Unpassivated and Surfactant-Passivated Bulk Facets of Wurtzite CdSe: A Model System for Studying the Anisotropic Growth of CdSe Nanocrystals"; Journal of Physical Chemistry B, 2005, vol. 109, No. 13, pp. 6183-6192.

Murray et al., "Synthesis and Characterization of Monodisperse Nanocrystals and Close-packed Nanocrystal Assemblies", Annual Reviews of Materials Science, Aug. 2000, vol. 30, pp. 545-610.

Nakada et al, "Preparation and Characterization of CuInSe2 Films for PV Applications by Low Pressure Vapor Phase Selenization", Proceedings of the 11th E.C. Photovoltaic Solar Energy Conference, pp. 794-797 Oct. 12-16, 1992.

Noufi et al. "Chemical Fluctuation-induced Nanodomains in Cu(In,Ga)Se2 films," 20th European Photovoltaic Solar Energy Conference, Jun. 6-10, 2005, Barcelona, Spain, pp. 1744-1747.

Nowlan et al. "Direct Cover Glass Bonding to GaAs and GaAs/Ge Solar cells" Proceedings of the Photovoltaic Specialists Conference, Las Vegas, Oct. 7-11, 1991, pp. 1480-1484.

Park et al., "Phase-controlled One-Dimensional Shape Evolution of InSe Nanocrystals", Journal of the American Chemical Society, Oct. 28, 2006, vol. 128, No. 46, pp. 14780-14781.

Peng et al., "Epitaxial Growth of Highly Luminescent CdSe/CdS Core/Shell Nanocrystals with Photostability and Electronic Accessibility", Journal of the American Chemical Society, Jul. 30, 1997, vol. 119, No. 30, pp. 7019-7029.

Pinna et al., "Triangular CDS Nanocrystals: Structural and Optical Studies", Advanced Materials, Feb. 2001, vol. 13, No. 4, pp. 261-264.

Probst et al., "Advanced Stacked Elemental Layer Process for Cu(InGa)Se2 Thin Film Photovoltaic Devices," MRS Proceedings, 1996, vol. 426, pp. 165-176.

Probst et al., "Rapid CIS-process for high efficiency PV-modules: development towards large area processing," Thin Solid Films, 2001, vol. 387, Nos. 1-2, pp. 262-267.

Probst et al., "The Impact of Controlled Sodium Incorporation on Rapid Thermal Processed Du(InGa)Se2—Thin Films and Devices," Photovoltaic Energy Conversion, 1994, Conference Record of the Twenty Fourth IEEE Photovoltaic Specialists Conference, 1994 IEEE First World Conference on Photovoltaic Energy Conversion—WPCPEC, Dec. 1994, pp. 144-147.

Puzder et al., "The Effect of Organic Ligand Binding on the Growth of CdSe Nanoparticles Probed by Ab Initio Calculations", Nano Letters, Oct. 2004, vol. 4, No. 12, pp. 2361-2365.

Revaprasadu et al, "Novel Single-molecule Precursor Routes for the Direct Synthesis of InS and InSe Quantum Dots", Journal of Materials Chemistry, 1999, vol. 9, pp. 2885-2888.

Ridley, "Printed Inorganic Transistors", Dissertation, Massachusetts Institute of Technology, Sep. 2003, pp. 1-175.

(56) References Cited

OTHER PUBLICATIONS

Schock, "Thin Film Photovoltaics", Applied Surface Science, Feb. 2, 1996, vol. 92, pp. 606-616.

Schulz et al., "CIGS Films Via Nanoparticle Spray Deposition: Attempts at Densifying a Porous Precursor", Presented at the 26th IEEE Photovoltaic Specialists Conference, Sep. 29-Oct. 3, 1997, Anaheim, CA, NREL CP-520-22959, pp. 1-5.

Stanbery et al., "Reaction Engineering and Precursor Film Deposition for CIS Synthesis", National Renewable Energy Laboratory and Sandia National Laboratories Photovoltaics Program Review Meeting, AIP Conference Proceedings, 1997, vol. 394, pp. 579-588.

Stanbery et al., "Role of Sodium in the Control of Defect Structures in CIS [solar cells]," Photovoltaic Specialists Conference, 2000. Conference Record of the Twenty-Eighth IEEE, Sep. 2000, pp. 440-445.

Stanbery, "Copper Indium Selenides and Related Materials for Photovoltaic Devices," Critical Reviews in Solid State and Material Sciences, Apr.-Jun. 2002, vol.27, No. 2, pp. 73-117.

English language translation of abstract of Japanese Patent Publication No. 2009528681, Aug. 2009.

English language translation of abstract of Japanese Patent Publication No. 2009528682, Aug. 2009.

English language translation of abstract of Japanese Patent Publication No. 2009540537, Nov. 2009.

English language translation of abstract of Japanese Patent Publication No. 2010132521, Jun. 2001.

Mitzi et al., Hydrazine-based deposition route for device-quality CIGS films, Thin Solid Films 517 (2009) 2158-2162.

\* cited by examiner

LIQUID PRECURSOR FOR DEPOSITION OF INDIUM SELENIDE AND METHOD OF PREPARING THE SAME

RELATED APPLICATION

The present Application is related to and takes priority from U.S. Provisional Application Ser. No. 61/401,607, filed Aug. 16, 2010, the teachings of which are incorporated herein by reference to the extent they do not conflict herewith.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Compounds of Groups IB, IIIA and VIA, including for example copper indium diselenide (CIS) and copper indium gallium diselenide (CIGS), have been studied as semiconductor materials for a number of thin-film semiconductor applications. One key application is their use as light absorbing materials in solar cell components. The elements, which form these compounds, are relatively common and fairly inexpensive, and when formulated and processed into light absorbing materials (e.g., CIS and GIGS), they are highly efficient in converting solar energy into electrical energy.

Unfortunately, cost effective methods of fabricating these light absorbing materials, especially in the form of thin films, have been elusive and limited at best. Most current fabrication methods of light absorbing materials (e.g., CIS and GIGS) rely on vacuum deposition techniques (e.g., physical vapor deposition), which are generally expensive and labor-intensive.

Recent advances in the thin film technology involve the use of liquid precursors to deposit precursors of light absorbing materials. Liquid precursors for use in thin film deposition represent less expensive alternatives to vacuum deposition technology. Liquid precursors provide distinct advantages over conventional vacuum deposition technology including higher throughput, lower cost and more efficient material utilization. In addition, liquid precursors are compatible with a broader range of substrate types and surface morphologies including very large substrates or those having considerable flexibility.

Liquid precursors are generally formulated to contain a combination of metal and a multinary chalcogenide material each selected, respectively, from the elements of Group IB, Group IIIA and Group VIA, utilizing hydrazine as a solvent. Upon deposition, the liquid precursor converts to a desired solid precursor or a metal chalcogenide through the application of heat. The deposited solid precursor can then be processed through suitable means in combination with other solid precursors to produce the final light absorbing material (e.g., CIS and GIGS).

The use of hydrazine as a solvent is problematic. Hydrazine is a volatile, corrosive liquid that is not only highly toxic and dangerously unstable, but also expensive. Its use is therefore strictly controlled. For the same reasons, hydrazine-containing liquid precursors require special care and handling including implementation of extensive safety measures. Thus, the cost and difficulty of making and using hydrazine-containing liquid precursors presents problems in the industry.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

An exemplary method of preparing a liquid precursor is disclosed having an indium selenide content defined by the formula $In_xSe_y$, wherein x and y are each in the range of 1 to 3 and wherein x+y is in the range of 2 to 5. Such liquid precursors are suitable for forming a solid precursor on a substrate, for example, in the form of thin films, which may be used, for example, in semiconductor applications such as the preparation of light absorbing materials for solar cells. The solid precursor is generally formed by heating the liquid precursor to a temperature and for a time sufficient to drive off the liquid components.

The exemplary method produces a liquid precursor starting from elemental selenium in the form of a liquid based material or composition that does not contain hydrazine and can be used in deposition techniques that are easier, more efficient and more cost effective than solid based deposition techniques such as vacuum deposition. The exemplary liquid precursors allow for deposition by suitable deposition techniques such as drop coating, dip coating, spin coating, spraying, brushing, air brushing, ink jet application, stamping, printing, pouring, wiping, smearing, spray deposition, slot coating, and other methods of applying liquids to the surface of a substrate. For example, the deposition technique may be spray deposition or slot coating.

The exemplary method eliminates the use of hydrazine entirely or eliminates the use of hydrazine in amounts where it can function as a solvent. Thus, the exemplary method eliminates the necessity of procedures known to be used for handling and removing hydrazine. The resulting liquid precursor is essentially hydrazine-free, thereby greatly enhancing safety and further reducing costs associated with the process for depositing a solid precursor on a substrate. The exemplary hydrazine-free liquid precursors permit deposition of solid precursors in a safer and more cost effective manner than those which contain hydrazine. In addition, the exemplary method produces liquid precursors with elevated precursor (i.e., indium-selenide) concentration levels, thus reducing the time necessary to generate the solid precursor. The exemplary liquid precursors can be used to form thin films having a desirable indium selenide composition suitable for use in forming CIS or CIGS thin films useful in the fabrication of solar cells.

Accordingly, an exemplary embodiment is directed to a method of preparing a liquid precursor which includes: contacting elemental selenium with an amount of at least one nitrogen-containing agent effective to yield a preliminary precursor solution; and combining the preliminary precursor solution with a solution of an indium salt and a solvent for the indium salt to yield the liquid precursor. In one such exemplary embodiment, hydrazine is not used as the nitrogen-containing agent. In another such exemplary embodiment, hydrazine is used as a nitrogen containing agent but in a controlled amount (e.g. stoichiometric amount) wherein hydrazine acts as a reducing agent and is essentially consumed by its reaction with elemental selenium. In this exemplary embodiment, a solvent may be used for the reaction. The exemplary embodiment encompasses the use of other reducing agents, as a replacement for hydrazine, which can reduce elemental selenium as shown by the chemical reaction represented in FIG. 1.

Another exemplary embodiment is directed to a method of depositing a solid precursor on a substrate, which includes applying a liquid precursor prepared by the exemplary method described above to the substrate, and heating the liquid precursor to a temperature and for a time sufficient to yield the deposited solid precursor on the substrate.

In another exemplary embodiment, there is provided a liquid precursor which includes a hydrazine-free solvent for a solute comprising indium and selenium; and a solute comprising indium and selenium.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather then limiting.

DETAILED DESCRIPTION

Figure 1:
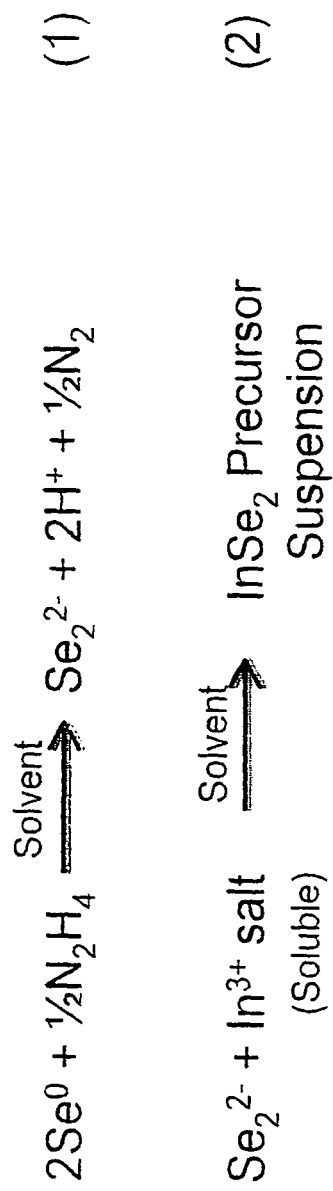
FIG. 1 is a schematic view of a chemical reaction of an embodiment for forming a liquid precursor.

An exemplary liquid precursor and method of preparing the same is disclosed which is suitable for depositing a desired chemical species or precursor (i.e., indium selenide) on a substrate. The deposited chemical species can then be heated to remove volatile components including any solvent which may be present to yield a solid precursor, for example, in the form of a thin film. The solid precursor of the desired chemical species can be used to form CIS (copper-indium-selenide) and/or CIGS (copper-indium/gallium-diselenide) light absorbing materials for solar cells.

The liquid precursor of one exemplary embodiment utilizes at least one nitrogen-containing agent which may act as a reducing agent and/or a solvent to form a selenium containing solution. When hydrazine is used as a nitrogen-containing agent, the amount (e.g. a stoichiometric amount) which is employed to form the preliminary precursor solution is sufficient to reduce up to 50% of the elemental selenium. Excess hydrazine is avoided so that hydrazine is not present in the liquid precursor.

When hydrazine is used and functions as a reducing agent, it is desirable to conduct the method in the presence of at least one additional nitrogen-containing agent and optionally in the presence of a non-nitrogen containing solvent such as glycol.

In another exemplary embodiment, hydrazine is omitted from the process and a suitable solvent such as ethylene diamine is used in solvent functioning amounts (i.e. greater than a stoichiometric amount) to dissolve the elemental selenium to form the preliminary precursor solution.

As indicated above, the liquid precursor of one exemplary embodiment does not employ hydrazine as a solvent. Accordingly, there is no hydrazine present in the liquid precursor and therefore special efforts to handle and remove hydrazine are eliminated.

In another exemplary embodiment, hydrazine is used but not in solvent functioning amounts. Instead, hydrazine is used in an amount only sufficient to reduce a portion of the elemental selenium (e.g. up to 50%). As a result, the hydrazine is converted to relatively harmless byproducts as represented in the reaction shown in FIG. 1. In yet another exemplary embodiment, selenium is reduced but not by hydrazine.

The exemplary liquid precursor comprises a molar ratio of In:Se of about 1:1 to 2:3. Typically, most of the selenium is associated with indium while a minor portion of selenium will be present in elemental form. The exemplary liquid precursor exhibits a relatively high concentration level of indium and selenium suitable for rapidly depositing a solid precursor, for example, in the form of a thin film, on a substrate. The indium concentration in the exemplary liquid precursor is in the range of about 0.10 M to about 0.50 M, whereas prior art liquid precursors with hydrazine added in solvent functioning amounts typically have an indium concentration of from about 0.02 M to about 0.04 M.

Indium selenide-containing depositions, for example, in the form of a thin film, are useful in the fabrication of CIS and/or CIGS light absorbing materials for solar cells. The indium selenide layer and the copper and/or gallium selenide layer(s) are placed in contact under reactive conditions including heat to form a desirable light absorbing material. An exemplary form of indium selenide for the light absorbing material is InSe and/or $In_2Se_3$. During heating to form the light absorbing material the amount and duration of heat can be tailored to control the molar ratio of In:Se. Still other examples are also contemplated.

In an exemplary embodiment, there is provided a method of preparing a liquid precursor or precursor composition having a desirable indium selenide content. The exemplary liquid precursor can be applied to a substrate such as glass and simultaneously thermally treated in a manner which provides a solid precursor, for example, in the form of a thin film, having a target indium selenide content as described above. The In:Se ratio may be determined by any suitable chemical analysis technique, such as, for example, inductively coupled plasma atomic emission spectroscopy (ICP-AES) or X-ray fluorescence spectroscopy (XRF).

An exemplary method for preparing one exemplary embodiment of the liquid precursor is represented in FIG. 1. The exemplary method involves reducing elemental selenium with a stoichiometric amount of a nitrogen-containing reducing agent such as, for example, hydrazine, in the presence of a solvent (excluding hydrazine) to yield a preliminary precursor solution, and combining the preliminary precursor solution with a solution of an indium salt and a solvent for the indium salt (excluding hydrazine) to yield the liquid precursor in the form of a suspension of small particles, as indicated in equations (1) and (2), respectively. The solvents used in these methods steps may be the same or different.

The term "nitrogen-containing agent" is intended to refer to a chemical compound containing nitrogen, which either 1) exhibits a standard reduction potential less than the standard reduction potential of selenium (i.e. acts as a reducing agent), and which is consumed in the oxidation-reduction reaction with selenium to yield byproducts which do not adversely affect the reduction reaction and are relatively harmless from an environmental standpoint or 2) functions as a solvent for elemental selenium when used in solvent functioning amounts. An exemplary example of a nitrogen-containing agent which functions as a reducing agent is hydrazine. Examples of nitrogen containing agents which may function as solvents include primary and secondary amines such as ethylene diamine.

As discussed above, the nitrogen-containing agent, for example, hydrazine, may be used to reduce elemental selenium in the presence of a solvent to form the preliminary precursor solution as indicated in equation (1) of FIG. 1. The term "preliminary precursor solution" is intended to refer to the mixture of the reduced elemental selenium and the solvent prior to mixing with a solution of the indium salt. Because hydrazine is used in controlled amounts to effect reduction, there is virtually no hydrazine present once the elemental selenium has been reduced.

The indium salt may be selected from any soluble indium salts including $In^{3+}$ salts such as, indium nitrate, indium chloride, indium triflate, and the like. The solvent used to form the preliminary precursor solution is any solvent which facilitates the conversion (e.g. the reduction reaction) of selenium to solution form (see equation (1) of FIG. 1). In the second step of the reaction, the solvent used therein facilitates the dissolution of the indium salt. Examples of compounds that may function as a solvent in the first step include nitrogen-containing agents such as primary and secondary amines as well as non-nitrogen containing compounds such as glycols. Specific examples of nitrogen-containing agents and solvents used in the first step of the method include, but are not limited to, ethylene diamine, pyridine, ethanolamine, diethylene triamine, N-methylimidizole, and ethylene glycol. The solvent used in the second step of the reaction includes those which facilitate the reaction shown in equation (2) of FIG. 1. Examples of these solvents include, but are not limited to, alcohols such as, for example, a lower alkanol preferably having 1-6 carbon atoms (e.g., methanol, ethanol, butanol), water, dimethylformamide as well as those solvents suitable for use in the first step of the method (e.g., glycols such as ethylene glycol or primary and secondary amines such as ethylene diamine).

When the nitrogen-containing agent is a reducing agent (e.g. hydrazine), it is preferably reacted with elemental selenium in stoichiometric amounts. In the exemplary method, utilizing hydrazine as a reducing agent (not as a solvent) in a stoichiometric amount ensures that hydrazine is completely consumed in the reaction with elemental selenium yielding nitrogen gas.

The preliminary precursor solution is thereafter combined or blended with the solution of the indium salt to yield the liquid precursor as a suspension of small particles as indicated in equation (2) of FIG. 1.

In another exemplary embodiment of forming the preliminary precursor solution elemental selenium is dissolved in a suitable solvent. The amount of the solvent must be sufficient to dissolve the elemental selenium and provide the preliminary precursor solution. Suitable amounts will depend on the particular solvent chosen but will generally be greater than a stoichiometric amount. Examples of such solvents include nitrogen-containing agents such as primary and secondary amines (e.g. ethylene diamine, pyridine, ethanolamine, diethylene triamine, N-methylimidizole and combinations thereof) and glycols (e.g. ethylene glycol).

Figure 2:
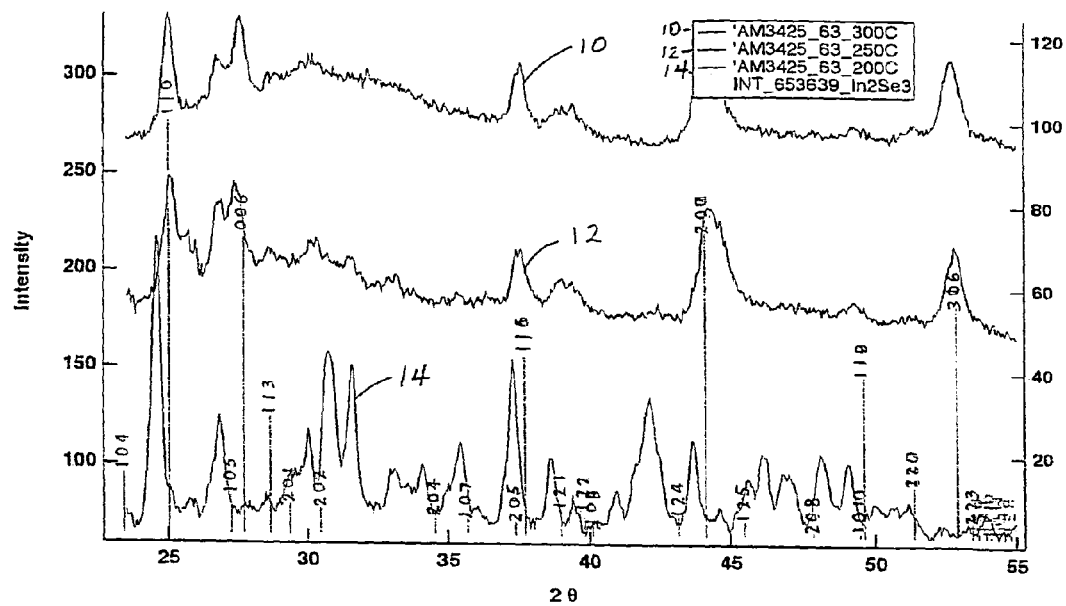
FIG. 2 is a trace view of X-ray diffraction patterns, representing three embodiments in which dropcast In—Se films were prepared at 200° C., 250° C. and 300° C., respectively.

In an exemplary method of depositing a solid precursor on a substrate, the resulting exemplary liquid precursor suspension is applied to the substrate under elevated temperature conditions sufficient to remove volatile components such as solvent. During this thermal process step, the exemplary liquid precursor suspension converts to a solid precursor (i.e., In—Se), for example, in the form of a thin film. The selection of a heat treating temperature and the duration of the heat treatment have been determined to control the atomic ratio of indium to selenium when the exemplary liquid precursor is deposited on the substrate (i.e., the relative amount of In and Se in the solid precursor). Relatively low temperatures favor the formation of a metal organic containing In and Se. Relatively higher temperatures favor the formation of the species $In_2Se_3$ (FIG. 2).

For example, deposition of the exemplary indium-selenide liquid precursor at a temperature of from about room temperature to 200° C., favors formation of a metal organic compound. If deposition is conducted at a temperature of about 250° C. to 300° C., the predominant species is $In_2Se_3$.

In the formation of CIS and CIGS absorption layers, indium selenide layers containing substantially pure $In_2Se_3$ may be used. Accordingly, an exemplary method of forming a CIS or CIGS absorption layer is to deposit the indium selenide layer at a temperature from about 250° C. to 300° C.

The exemplary liquid precursors allow for deposition by suitable deposition techniques such as drop coating, dip coating, spin coating, spraying, brushing, air brushing, ink jet application, stamping, printing, pouring, wiping, smearing, spray deposition, slot coating, and other methods of applying liquids to the surface of a substrate. For example, the deposition technique may include spray deposition or slot coating.

In an exemplary embodiment, the liquid precursor can be deposited in a single step heat treating method without resorting to multiple step processes in which the last heating step is rapid thermal processing (RTP). In particular, the liquid precursor may be heated and converted directly to the desirable indium selenide species as the liquid precursor is deposited on the substrate.

"Rapid thermal processing (RIP)" is defined herein as a heating regimen in which the target film is heated to a desired temperature in short time, e.g., no more than about 10 minutes. The desired temperature is maintained until the heating process is completed.

In a further exemplary method of depositing a solid precursor on a substrate, the exemplary liquid precursor suspension may be deposited on the substrate to form a solid precursor, for example, in the form of a thin film. Thereafter, the deposited liquid precursor is annealed at elevated temperatures to yield an indium selenide film containing $In_2Se_3$ as the predominant species. In the exemplary method, heating may be conducted while the exemplary liquid precursor is being deposited on the substrate in a single step process.

It will be understood that the one step heating process is exemplary and not required. Thus, the liquid precursor described herein may be initially deposited on a substrate at relatively low temperatures and thereafter treated at higher temperatures including rapid thermal processing.

The In—Se containing liquid precursor representing an embodiment makes efficient use of selenium and in an exemplary embodiment obviates the need for multiple heating steps. Because In—Se is produced in a relatively pure form, the liquid precursors can be used effectively to facilitate the formation of, for example, CIS or CIGS with large crystal grains in a solid state reaction with Cu—Se and optional Ga—Se.

In reference to FIG. 2, three exemplary embodiments of the present solid precursor in the form of a film represented by x-ray diffraction patterns 10, 12, and 14, are shown. The In—Se precursors were each deposited as a suspension in ethylene diamine and ethylene glycol dropcast on glass substrates at 200° C., 250° C., and 300° C., respectively. The X-ray diffraction pattern 14 of the film deposited at 200° C. indicates a number of peaks which do not match with any known In—Se phase and is presumed to be a crystalline form of the corresponding precursor. The films deposited at 250° C. and 300° C., respectively, each generated X-ray diffraction patterns 12 and 10, respectively, that correspond to a cubic $In_xSe_y$ phase. It is further noted that the In:Se ratio in the dropcast films was determined through X-ray fluorescence to be 1:1.

Figure 3:
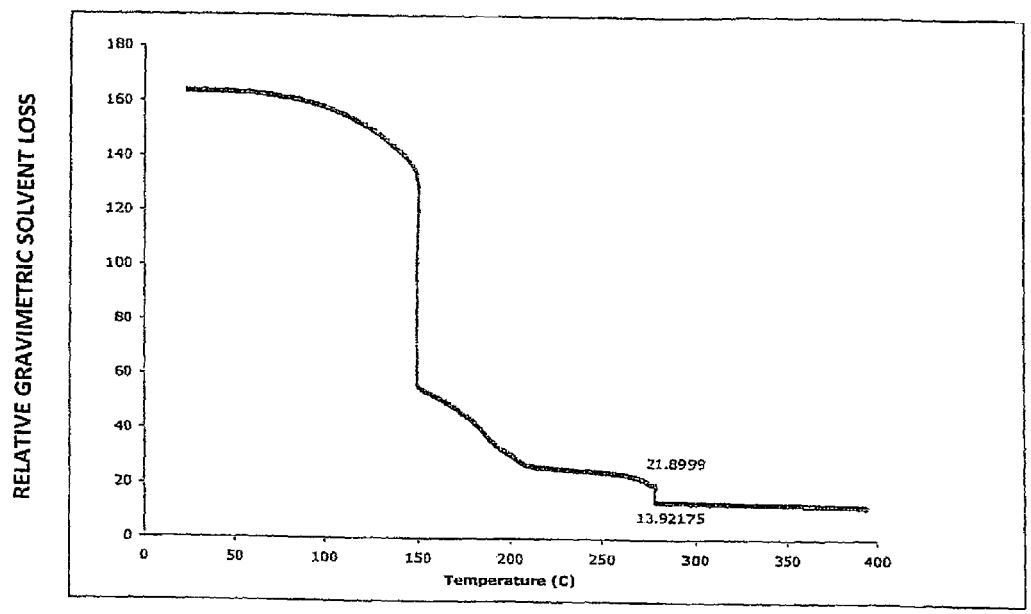
FIG. 3 is a trace view of a thermogravimetric analysis characterization of changes in weight in relation to change in temperature of the In—Se liquid precursor for one embodiment.

In reference to FIG. 3, the thermal decomposition of the liquid precursor composed of In—Se precursor suspension in ethylene diamine/ethylene glycol mixed solvent, was examined using thermogravimetric analysis (TGA) techniques. The TGA trace in FIG. 3 shows loss of solvents in two well defined steps as the deposited liquid precursor converts to the desired stable In—Se precursor at about 275° C.

EXAMPLES

Specific embodiments will now be further described by the following, non-limiting examples which will serve to illustrate in some detail various features. The following examples are included to facilitate an understanding of ways in which an embodiment may be practiced. It should be appreciated that the examples, which follow represent embodiments discovered to function well in practice. However, it should be appreciated that many changes can be made in the exemplary embodiments which are disclosed while still obtaining like or similar results without departing from the spirit and scope of the claims. Accordingly, the examples should not be construed as limiting the scope of the claims.

Example 1

A solution of selenium in ethylene diamine was prepared by placing Se powder (2.38 g, 0.030 mole) and ethylene diamine (40 mL) in a flask under a nitrogen atmosphere and adding anhydrous hydrazine (0.160 g, 0.005 mole). The resulting red solution was added over a 45 min period to a stirred solution of indium chloride (3.32 g, 0.015 mole) in 125 mL of pyridine to produce a viscous, dark red suspension. This precursor suspension was drop cast on glass substrates heated at 300° C. The composition of the film was determined by X-ray fluorescence (XRF). The composition found was 50 atomic % In and 50 atomic % Se (Se/In=1.0).

Example 2

A solution of selenium in ethylene diamine was prepared by placing Se powder (3.16 g, 0.040 mole) and ethylene diamine (40 mL) in a flask under a nitrogen atmosphere and adding anhydrous hydrazine (0.320 g, 0.010 mole). The resulting red solution was added over a 45 min period to a stirred solution of indium(III) chloride hydrate (11.72 g, 0.040 mole) in 40 mL of ethylene glycol. The exothermic reaction produced an orange suspension that was stable for several days without phase separation. This precursor suspension was dropcast on glass substrates at 200, 250, and 300° C. and the XRD traces of the resulting deposits are shown in FIG. 2. The composition of the film deposited at 200° C. was determined by X-ray fluorescence (XRF). The composition found was 50 atomic % In and 50 atomic % Se (Se/In=1.0).

Example 3

A solution of selenium in ethylene diamine was prepared by placing Se powder (0.79 g, 0.010 mole) and ethylene diamine (20 mL) in a flask under a nitrogen atmosphere and adding anhydrous hydrazine (0.160 g, 0.005 mole). The resulting red solution was added over a 45 min period to a stirred solution of indium(III) trifluoromethanesulfonate (2.81 g, 0.005 mole) in 20 mL of ethylene diamine. The exothermic reaction produced a brown solution that was stable for several days without precipitation.

Example 4

A solution of selenium in ethylene diamine was prepared by placing Se powder (0.79 g, 0.010 mole) and ethylene diamine (20 mL) in a flask under a nitrogen atmosphere and adding anhydrous hydrazine (0.080 g, 0.0025 mole). The resulting red solution was added over a 45 min period to a stirred solution of indium(III) nitrate hydrate (3.82 g, 0.010 mole) in 20 mL of ethylene glycol. The reaction produced an orange suspension that was stable for several days without phase separation.

Example 5

A solution of selenium in ethylene diamine was prepared by placing Se powder (0.79 g, 0.010 mole) and ethylene diamine (40 mL) in a flask under a nitrogen atmosphere and heating the mixture to 120° C. for 3 hours, at which point the selenium was completely dissolved to form a red solution. This red solution was added over a 15 minute period to a stirred solution of indium(III) nitrate hydrate (3.82 g, 0.010 mole) in 20 mL of dimethylformamide under a nitrogen atmosphere. The reaction produced an orange solution that was stable for several days without precipitation. This precursor solution was deposited on glass substrates by spray deposition at a substrate temperature of 200° C. The composition of the resulting film was determined by X-ray fluorescence (XRF). The composition found was 50 atomic % In and 50 atomic % Se (Se/In=1.0).

While a number of exemplary aspects and embodiments have been discussed above, those of skill in the art will recognize certain modifications, permutations, additions, and sub-combinations thereof. It is therefore not intended that the following appended claims and claims hereafter introduced and interpreted to include all such modifications, permutations, additions, and sub-combinations as are within their true spirit and scope.

What is claimed is:

1. A method of preparing a liquid indium selenide precursor, the method comprising:
   reducing elemental selenium with a stoichiometric amount of hydrazine in the presence of a first solvent to yield a first solution comprising $Se_2^{2-}$; and
   combining the first solution with a second solution comprising an indium salt and a second solvent to yield the liquid indium selenide precursor comprising a suspension of indium selenide particles,
   wherein the liquid indium selenide precursor is substantially hydrazine-free.

2. The method of claim 1, wherein at least one of the first solvent or the second solvent comprises at least one of a primary amine or a secondary amine.

3. The method of claim 2, wherein at least one of the first solvent or the second solvent comprises at least one of ethylene diamine, ethanolamine, or diethylene triamine.

4. The method of claim 1, wherein the hydrazine reduces up to 50% of the elemental selenium.

5. The method of claim 1, wherein at least one of the first solvent or second solvent comprises at least one non-nitrogen-containing solvent.

6. The method of claim 5, wherein the non-nitrogen-containing solvent comprises at least one of a glycol, an alcohol, or water.

7. The method of claim 1, wherein the second solvent comprises at least one of an alcohol, a glycol, water, a primary amine, or a secondary amine.

8. The method of claim 1, wherein the second solvent comprises at least one of methanol, ethanol, butanol, or ethylene glycol.

9. The method of claim 1, wherein the indium salt comprises at least one of indium nitrate, indium chloride, or indium triflate.

10. The method of claim 1, wherein the liquid indium selenide precursor comprises indium having a concentration between 0.10 M and 0.50 M.

11. A method of depositing a solid indium selenide precursor on a substrate comprising:
applying the liquid indium selenide precursor prepared by the method of claim 1 to the substrate; and
heating the liquid indium selenide precursor to a temperature and for a time sufficient to yield the deposited solid indium selenide precursor on the substrate.

12. The method of claim 11, wherein the deposited solid indium selenide precursor is a thin film.

13. The method of claim 11, wherein the heating step is conducted at a temperature of at least 250° C.

14. The method of claim 13, wherein the temperature is between 250° C. and 300° C.

15. The method of claim 11, wherein the deposited solid indium selenide precursor comprises InSe.

16. The method of claim 11, wherein the applying comprises at least one of drop coating, dip coating, spin coating, spraying, brushing, air brushing, ink jet application, stamping, printing, pouring, wiping, smearing, spray deposition, or slot coating.

17. The method of claim 11, wherein the liquid indium selenide precursor comprises indium with a concentration between 0.10 M and 0.50 M.

* * * * *